(12) United States Patent
Yokomizo et al.

(10) Patent No.: US 11,233,495 B2
(45) Date of Patent: Jan. 25, 2022

(54) MIXER

(71) Applicant: MITSUBISHI ELECTRIC CORPORATION, Tokyo (JP)

(72) Inventors: Shinya Yokomizo, Tokyo (JP); Akihito Hirai, Tokyo (JP); Mitsuhiro Shimozawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/936,148

(22) Filed: Jul. 22, 2020

(65) Prior Publication Data

US 2020/0350886 A1 Nov. 5, 2020

Related U.S. Application Data

(63) Continuation of application No. PCT/JP2018/005017, filed on Feb. 14, 2018.

(51) Int. Cl.
*H03H 7/20* (2006.01)
*H03C 3/09* (2006.01)
*H03D 7/16* (2006.01)
*H04B 7/08* (2006.01)
*H04B 7/06* (2006.01)
(Continued)

(52) U.S. Cl.
CPC ............. *H03H 7/20* (2013.01); *H01Q 3/36* (2013.01); *H03C 3/09* (2013.01); *H03D 7/16* (2013.01); *H03D 7/165* (2013.01); *H03H 11/20* (2013.01); *H04B 7/0617* (2013.01); *H04B 7/0671* (2013.01); *H04B 7/086* (2013.01); *H03D 2200/0082* (2013.01)

(58) Field of Classification Search
CPC .... H04B 7/0617; H04B 7/0671; H04B 7/086; H01Q 3/36; H03D 7/165; H03D 2200/0082; H03H 11/20; H03H 11/16; H03H 7/20; H03C 3/40
See application file for complete search history.

(56) References Cited

U.S. PATENT DOCUMENTS 6,417,712 B1 * 7/2002 Beards ............... H03C 3/40
327/231
8,532,226 B2 9/2013 Wambacq
(Continued)

OTHER PUBLICATIONS

Koh et al., "A6-18 GHz 5-Bit Active Phase Shifter", Microwave Symposium Digest (Mtt), IEEE MTT-S International, 2010, pp. 792-795.

*Primary Examiner* — Ryan Johnson
(74) *Attorney, Agent, or Firm* — Birch, Stewart, Kolasch & Birch, LLP

(57) ABSTRACT

A mixer includes: a VGA (12) configured to amplify one of divided two portions of an input signal at a gain of cos θ; a VGA (13) configured to amplify another one of the divided two portions of the input signal at a gain of sin θ; an IQ generator (15) configured to input an LO wave, and output an LO wave in phase with the input LO wave and an LO wave having a phase difference of 90° with respect to the input LO wave; a mixer (16) configured to input the signal output from the VGA (12) and the LO wave which is output from the IQ generator (15), to output an RF signal; a second mixer (17) configured to input the signal from the VGA (13) and the LO wave which is output from the IQ generator, to output an RF signal; and a combiner (18).

4 Claims, 6 Drawing Sheets

(51) Int. Cl.
    *H01Q 3/36*     (2006.01)
    *H03H 11/20*     (2006.01)

(56) References Cited

U.S. PATENT DOCUMENTS

| | | |
|---|---|---|
| 8,755,756 B1 | 6/2014 | Zhang et al. |
| 9,729,179 B1 | 8/2017 | Emadi et al. |
| 2012/0155580 A1 | 6/2012 | Wang et al. |

* cited by examiner

MIXER

CROSS REFERENCE TO RELATED APPLICATION

This application is a Continuation of PCT International Application No. PCT/JP2018/005017, filed on Feb. 14, 2018, which is hereby expressly incorporated by reference into the present application.

TECHNICAL FIELD

The present invention relates to a mixer, and more particularly, to a mixer which is to be used in a communication system and has a phase shift function.

BACKGROUND ART

The mixer is a circuit for executing frequency conversion to a frequency band desired by a user in a communication system of a direct conversion type or a superheterodyne type.

Meanwhile, a phase shifter is a circuit configured to apply suitable phase shift to an input signal in a communication apparatus or a radar configured to execute beam forming. The phase shifter is used in order to execute beam control toward any direction desired by the user.

A technology relating to the phase shifter is described in, for example, Non Patent Literature 1. The phase shifter described in Non Patent Literature 1 is formed of an IQ generator, two variable gain amplifiers (VGAs) provided on a subsequent stage of the IQ generator, and a combiner configured to combine signals output from those VGAs with one another.

The IQ generator generates, from an input signal, an I signal in phase with the input signal and a Q signal having a phase difference of 90° with respect to the input signal. The I signal is input to one VGA. The Q signal is input to another VGA. The one VGA amplifies the I signal at a gain of cos θ. The another VGA amplifies the Q signal at a gain of sin θ. In this case, θ is a phase shift amount. A combiner 7 combines the signal output from the VGA 5 and the signal output from the VGA 6 with one another.

When both of the frequency conversion and the phase shift are executed in this configuration, the phase shifter is connected to a subsequent stage of a mixer configured to execute the frequency conversion. In this case, the signal converted in frequency by the mixer is input to the IQ generator of the phase shifter. The IQ generator outputs the I signal in phase with the signal input from the mixer and the Q signal having the phase difference of 90° with respect to the signal input from the mixer. The I signal output from the IQ generator is amplified at the gain of cos θ by the one VGA. Meanwhile, the Q signal output from the IQ generator 4 is amplified at the gain of sin θ by the VGA 6. The combiner 7 combines the signals output from those VGAs 5 and 6 with one another. As a result, a signal that is shifted in phase by θ° with respect to the signal input to the mixer and is converted in frequency is generated.

In such a manner, the frequency conversion and the phase shift can be applied to the signal input to the mixer by connecting the related-art phase shifter to the subsequent stage of the mixer so as to form the one circuit.

CITATION LIST

Non Patent Literature

[NPL 1] Kwang-Jin Koh, and Gabriel M. Rebeiz, "A 6-18 GHz 5-Bit Active Phase Shifter", Microwave Symposium Digest (MTT), IEEE MTT-S International, 2010, pp. 792-795.

SUMMARY OF INVENTION

Technical Problem

As described above, the related-art phase shifter includes the IQ generator provided on a signal path in order to generate the I signal and the Q signal. However, the IQ generator has such a problem that passive elements such as resistors and capacitors have large transmission losses on the signal path particularly in a high-frequency band. As a result, when the phase shifter is connected to the subsequent stage of the mixer, a loss occurs in a signal that has passed through the IQ generator. Therefore, it is required to add an amplifier to a subsequent stage of the phase shifter in order to obtain required signal power. However, there is such a problem that the addition of the amplifier increases power consumption.

The present invention has been made in order to solve the above-mentioned problem, and has an object to provide a mixer for achieving both of a frequency conversion function and a phase shift function while suppressing transmission loss and power consumption.

Solution to Problem

According to one embodiment of the present invention, there is provided a mixer including: a control unit configured to input a value of a phase shift amount of θ°, and calculate a gain of cos θ and a gain of sin θ so as to execute control; a first VGA configured to input an input signal in a first frequency band from an input terminal, and amplify the input signal at the gain of cos θ to output the amplified input signal as a first signal; a second VGA configured to input the input signal from the input terminal, and amplify the input signal at the gain of sin θ to output the amplified input signal as a second signal; an IQ generator configured to input an LO wave, and output a first LO wave in phase with the LO wave and a second LO wave having a phase difference of 90° with respect to the LO wave; a first mixer, which is connected to a subsequent stage of the first VGA, and is configured to input the first LO wave output from the IQ generator, and use the first LO wave so as to apply, to the first signal, frequency conversion to a second frequency band, to thereby generate a third signal in phase with the input signal; a second mixer, which is connected to a subsequent stage of the second VGA, and is configured to input the second LO wave output from the IQ generator, and use the second LO wave so as to apply, to the second signal, frequency conversion to the second frequency band, to thereby generate a fourth signal having a phase difference of 90° with respect to the input signal; and a combiner, which is connected to a subsequent stage of the first mixer and the second mixer, and is configured to apply vector composition to the third signal and the fourth signal, to thereby generate and output a fifth signal shifted in phase by the phase shift amount of θ° with respect to the input signal.

Advantageous Effects of Invention

According to the mixer of the present invention, an IQ generator is not provided on the signal path, and the transmission loss is thus suppressed. Consequently, the use of the amplifier is not required. Therefore, there is thus provided such effects that the power consumption can be suppressed, and both the frequency conversion function and the phase shift function can be achieved.

DESCRIPTION OF EMBODIMENTS

Now, embodiments of the present invention are described with reference to the drawings.

Figure 9:
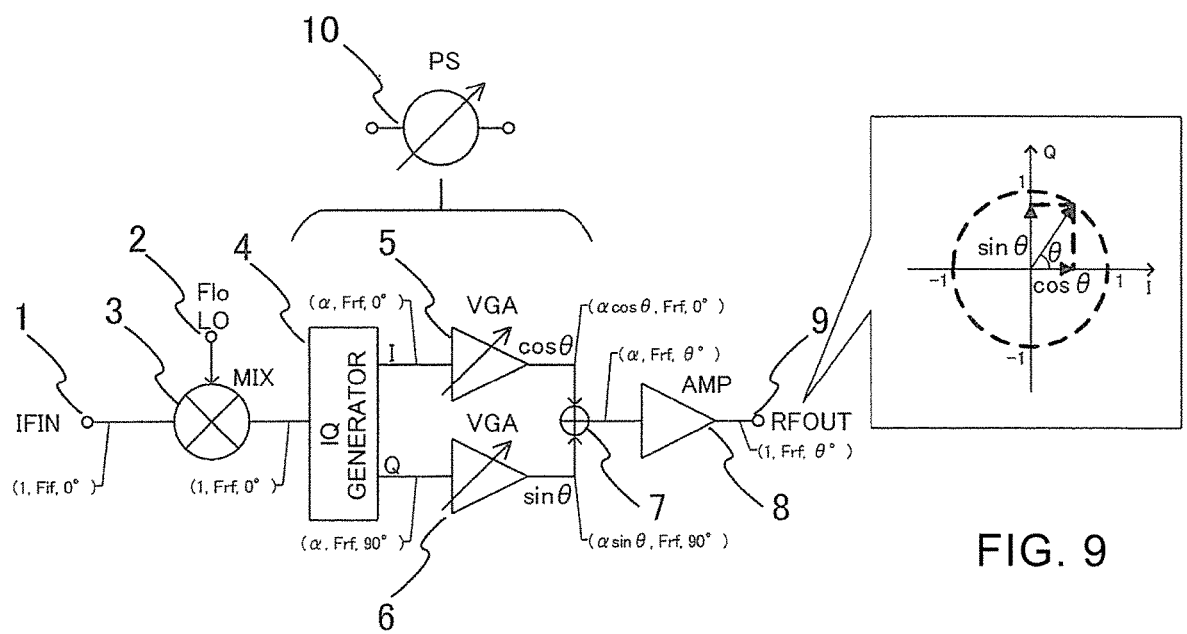
FIG. 9 is a diagram for illustrating one configuration example of a related-art circuit configured to execute frequency conversion from an IF band to an RF band and phase shift.

Referring to FIG. 9, a description is now given of an example of a related-art general circuit configuration as a comparative example of the embodiments of the present invention before the embodiments of the present invention are described. A circuit of FIG. 9 includes a mixer (hereinafter referred to as "MIX") 3, a phase shifter 10, and an amplifier 8. The MIX 3 is formed of, for example, a phase shifter described in Non Patent Literature 1. The circuit of FIG. 9 is a circuit configured to execute frequency conversion from an intermediate frequency (IF) band to a radio frequency (RF) band, and a phase shift.

The phase shifter (PS) 10 includes an IQ generator 4, a VGA 5, a VGA 6, and a combiner 7. In FIG. 9, an IFIN terminal 1 indicates an input terminal to which a signal in the IF band is to be input. An RFOUT terminal 9 indicates an output terminal from which a signal in the RF band is to be output. A local oscillator (LO) terminal 2 is an input terminal to which an LO wave is to be input. The value α (0<α<1) indicates a gain of the IQ generator 4. Moreover, in FIG. 9, a notation of, for example, "(1, Fif, 0°)" indicates values (amplitude, frequency, phase) at each node. Moreover, a frequency in the IF band is indicated as Fif. A frequency of the LO wave is indicated as Flo. A frequency in the RF band is indicated as Frf. Moreover, a high/low relationship among frequencies in the respective frequency bands is given by Fif<Frf=Flo±Fif.

A description is now given of an operation of the circuit of FIG. 9. First, the signal in the IF band input from the IFIN terminal 1 and the LO wave input from the LO terminal 2 are input to the MIX 3. The MIX 3 executes frequency conversion of adding the frequency Fif of the signal in the IF band and the frequency Flo of the LO wave to one another, to thereby obtain the frequency Frf, which is a conversion from the frequency Fif to the frequency Frf.

The output of the MIX 3 is input to the IQ generator 4. The IQ generator 4 outputs an I signal in phase with the signal input from the MIX 3 and a Q signal having a phase difference of 90° with respect to the signal input from the MIX 3. The I signal output from the IQ generator 4 is amplified at a gain of cos θ by the VGA 5. Meanwhile, the Q signal output from the IQ generator 4 is amplified at a gain of sin θ by the VGA 6. The combiner 7 combines a signal output from the VGA 5 and a signal output from the VGA 6 with each other, to thereby generate an RF signal obtained by a phase shift of θ° with respect to the output signal of the MIX 3 and the frequency conversion, and output the RF signal from the RFOUT terminal 9.

In the circuit of FIG. 9, the IQ generator 4 generates the I signal and the Q signal from the signal converted in frequency by the MIX 3. Thereafter, the I signal and the Q signal are amplified at cos θ and sin θ by the VGA 5 and VGA 6, respectively.

In such a manner, as illustrated in FIG. 9, the IQ generator 4 is provided on the signal path in order to generate the I signal and the Q signal in the related-art general circuit. However, the IQ generator 4 is formed of passive elements such as resistors and capacitors as described above, and has a large transmission loss on the signal path. As a result, a loss occurs in the signals that have passed through the IQ generator 4. Therefore, the amplifier 8 is added to a subsequent stage of the phase shifter 10 in order to obtain required signal power. However, there is such a problem that the addition of the amplifier 8 increases power consumption.

First Embodiment

Figure 1:
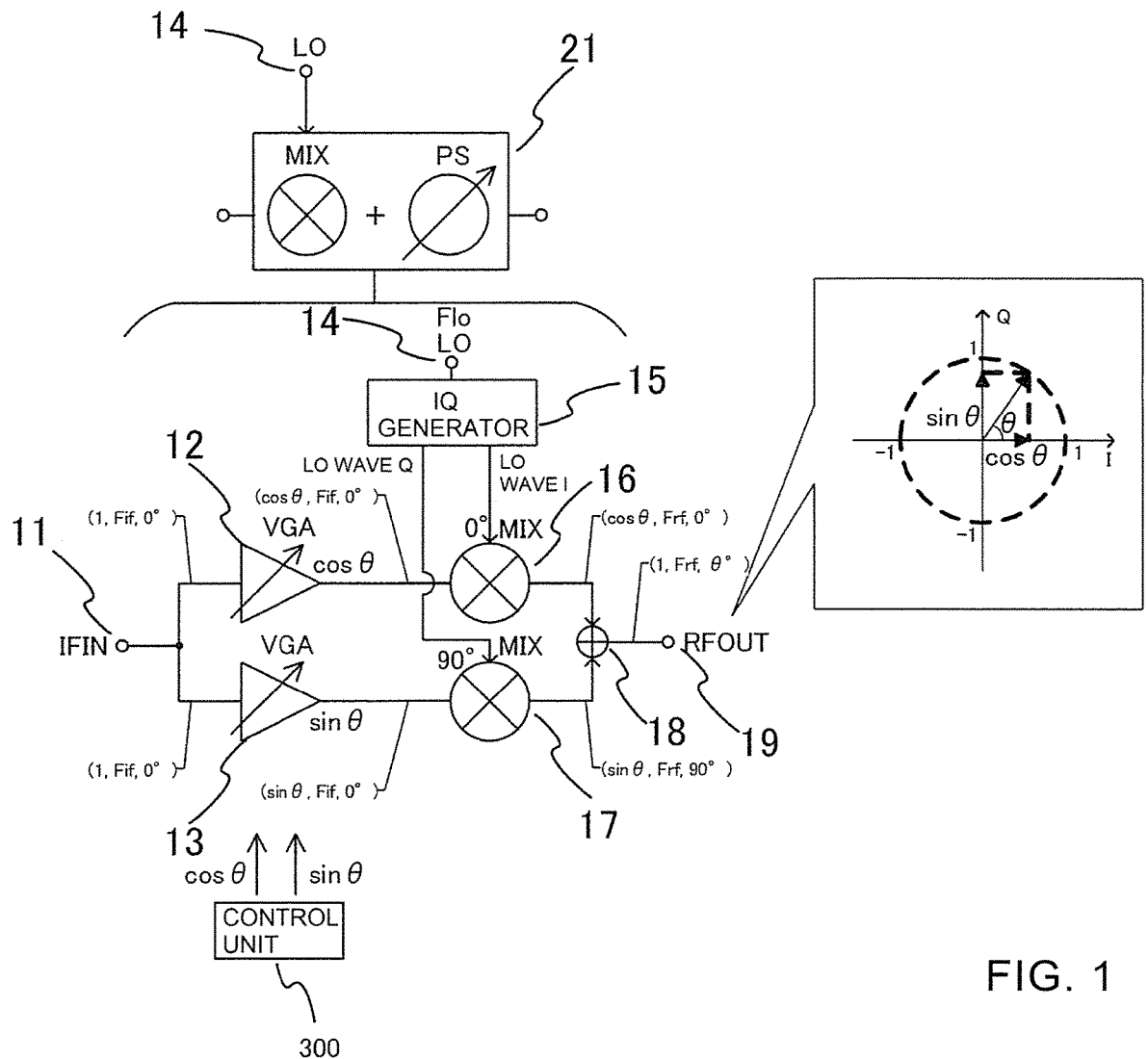
FIG. 1 is a diagram for illustrating one configuration example of a transmission mixer incorporating a phase shift function according to a first embodiment of the present invention.

FIG. 1 is a diagram for illustrating one configuration example of a mixer according to a first embodiment of the present invention. FIG. 1 is an illustration of one configuration example of a transmission mixer 21 incorporating a phase shift function as a mixer according to the first embodiment. The transmission mixer 21 includes a VGA 12 serving as a first VGA, a VGA 13 serving as a second VGA, an IQ generator 15, a MIX 16 serving as a first mixer, a MIX 17 serving as a second mixer, a combiner 18, and a control unit 300. In FIG. 1, an IFIN terminal 11 is an input terminal configured to input an IF signal. An LO terminal 14 is an input terminal configured to input an LO wave. An RFOUT terminal 19 is an output terminal configured to output an RF signal. Moreover, a notation of, for example, "(1, Fif, 0°)" of FIG. 1 indicates values of (amplitude, frequency, phase) at each node. Further, a frequency in the IF band is indicated as Fif. A frequency of the LO wave is indicated as Flo. A frequency in the RF band is indicated as Frf. It is assumed that a high/low relationship among frequencies in the respective frequency bands is given by Fif<Frf=Flo±Fif.

A description is now given of a case in which frequency conversion from the IF band as a first frequency band to the RF band as a second frequency band is executed, but the frequency conversion is not limited to this case, and the first frequency band and the second frequency band may appropriately be set to any values.

The transmission mixer 21 is configured in such a manner, and has a function of the frequency conversion and a function of the phase shift.

A description is now given of each of the components.

As illustrated in FIG. 1, the VGA 12, the VGA 13, the MIX 16, the VGA 17, and the combiner 18 are provided on a signal path between the IFIN terminal 11 and the RFOUT terminal 19. The IQ generator 15 is not provided on the signal path, and is arranged outside of the signal path.

Moreover, the control unit 300 is provided for the transmission mixer 21. The value of θ° is input from the outside to the control unit 300. The value θ° is a phase shift amount at the RFOUT 19. The control unit 300 internally includes a circuit configured to calculate values of cos θ and sin θ based on the value of θ°, to thereby control the gain of cos θ of the VGA 12 and the gain of sin θ of the VGA 13. Moreover, the control unit 300 also controls the frequency Flo of the LO wave input to the IQ generator 15. The control unit 300 sets the value of the frequency Flo of the LO wave so as to execute the frequency conversion from the first frequency band set in advance to the desired second frequency band.

The signal (1, Fif, 0°) in the IF band input to the IFIN terminal 11 is divided into two portions. One of the two portions is input to the VGA 12, and another one is input to the VGA 13. The respective signals, which are the divided two portions, are signals in phase.

One of the divided two portions of the signal (1, Fif, 0°) in the IF band is input to the VGA 12. The VGA 12 amplifies the IF signal at the gain of cos θ. In this case, the gain of cos θ is controlled by the control unit 300, and is thus variable. The VGA 12 is only required to be configured to achieve the gain of cos θ for any value of θ. Thus, the configuration is not particularly limited, and any configuration can be used as the VGA 12.

Another of the divided two portions of the signal (1, Fif, 0°) in the IF band is input to the VGA 13. The VGA 13 amplifies the IF signal at the gain of sin θ. In this case, the gain of sin θ is controlled by the control unit 300, and is thus variable. The VGA 13 is only required to be configured to achieve the gain of sin θ for any value of θ. Thus, the configuration is not particularly limited, and any configuration can be used as the VGA 13.

The LO wave is input to the LO terminal 14 of the IQ generator 15. The IQ generator 15 outputs an LO wave (hereinafter referred to as "LO wave I") in phase with the LO wave and an LO wave (hereinafter referred to as "LO wave Q") having a phase difference of 90° with respect to the LO wave. In such a manner, the IQ generator 15 is only required to be configured to output the LO wave I and the LO wave Q for the input LO wave. Thus, the configuration is not particularly limited, and any configuration can be used as the IQ generator 15.

The MIX 16 is connected to a subsequent stage of the VGA 12, and is provided on the signal path. The MIX 16 is a frequency converter having a function of mixing the output signal of the VGA 12 and the LO wave I output from the IQ generator 15 with one another. The MIX 16 outputs a sum signal and a difference signal of the two signals different in frequency from one another. Moreover, the MIX 16 has the function of mixing two signals, which are different in frequency from one another, with one another, and thus outputs a signal having a phase sum or a phase difference of the two signals also in terms of a phase relationship. For the sake of simple description, a consideration is only given of the function of summation of the MIX 16. That is, in this case, the MIX 16 multiplies amplitudes of the two signals by one another, and sums the frequencies and the phases of the two signals to one another.

The MIX 17 is connected to a subsequent stage of the VGA 13, and is provided on the signal path. The MIX 17 is a frequency converter having a function of mixing the output signal of the VGA 13 and the LO wave Q output from the IQ generator 15 with one another. The MIX 17 outputs a sum signal and a difference signal of the two signals different in frequency from one another. Moreover, the MIX 17 has the function of mixing two signals, which are different in frequency from one another, with one another, and thus outputs a signal having a phase sum or a phase difference of the two signals also in terms of a phase relationship. For the sake of simple description, a consideration is only given of the function of summation of the MIX 17. That is, in this case, the MIX 17 multiplies amplitudes of the two signals by one another, and sums the frequencies and the phases of the two signals to one another.

The combiner 18 applies vector composition to the output of the MIX 16 and the output of the MIX 17, to thereby generate a combined signal. The generated combined signal is output from the RFOUT terminal 19 to the outside.

A description is now given of an operation of the transmission mixer 21 of FIG. 1.

In the transmission mixer 21, the signal (1, Fif, 0°) in the IF band input to the IFIN terminal 11, which is the input terminal of the IF signal, is divided into the two portions, and the respective two portions are input to the VGA 12 and the VGA 13. It is assumed that the amplitudes remain the same. The VGA 12 and the VGA 13 have the gains of cos θ and sin θ, respectively. Thus, the signal (cos θ, Fif, 0°) in the IF band is output from the VGA 12, and the signal (sin θ, Fif, 0°) in the IF band is output from the VGA 13. The signal output from the VGA 12 is referred to as "first signal", and the signal output from the VGA 13 is referred to as "second signal".

The MIX 16 executes the mixing processing for the signal (cos θ, Fif, 0°) in the IF band output from the VGA 12 and the LO wave I (1, Flo, 0°) output from the IQ generator 15 so as to execute the frequency conversion from the IF band to the RF band, to thereby obtain the signal in the RF band. In this mixing processing, the amplitudes are multiplied by one another, and a result is thus given by cos θ×1=cos θ. The frequencies are summed to one another, and a result is thus given by Flo+Fif=Frf. The phases are summed to one another, and a result is thus given by 0+0=0°. Thus, the MIX 16 obtains the signal (cos θ, Frf, 0°) in the RF band through this mixing processing, and outputs the obtained signal. The signal output from the MIX 16 is referred to as "third signal".

The MIX 17 executes the mixing processing for the signal (sin θ, Fif, 0°) in the IF band output from the VGA 13 and the LO wave Q (1, Flo, 90°) output from the IQ generator 15 so as to execute the frequency conversion from the IF band to the RF band, to thereby obtain the signal in the RF band. In this mixing processing, the amplitudes are multiplied by one another, and a result is thus given by sin θ×1=sin θ. The frequencies are summed to one another, and a result is thus given by Flo+Fif=Frf. The phases are summed to one another, and a result is thus given by 0+90=90°. Thus, the MIX 17 obtains the signal (sin θ, Frf, 90°) in the RF band through this mixing processing, and outputs the obtained signal. The signal output from the MIX 17 is referred to as "fourth signal".

The combiner 18 applies the vector composition to the output signal (cos θ, Frf, 0°) of the MIX 16 and the output signal (sin θ, Frf, 90°) of the MIX 17, to thereby output the signal (1, Frf, θ°) in the RF band as shown in the inserted graph of FIG. 1. The signal in the RF band is a signal obtained by applying the frequency conversion to the RF band and the phase shift by the phase shift amount of θ° to the signal in the IF band input to the IFIN terminal 11. The signal output from the combiner 18 is referred to as "fifth signal".

In such a manner, in the first embodiment, the control unit 300 adjusts the gain of cos θ and the gain of sin θ of the VGA 12 and the VGA 13, respectively, to thereby be able to achieve the phase shift by any phase shift amount of θ°, and the mixer having the phase shift function can thus be achieved in this configuration. In this case, consideration is given of only the signal having the sum frequency, but the same operation is executed also for the signal having the difference frequency.

As described above, in the mixer according to the first embodiment, as illustrated in FIG. 1, the input signal is amplified by the VGA 12 and the VGA 13 at the gain of cos θ and the gain of sin θ, respectively. Then, the signals amplified by the MIX 16 and the MIX 17 are converted in frequency through use of the LO wave I and the LO wave Q, respectively.

The mixer according to the first embodiment has the above-mentioned configuration, and when the mixer is used as the transmission mixer, the frequency conversion function and the phase shift function can be achieved as in the related art even with the configuration without providing the IQ generator 15 on the signal path. Therefore, attenuation of the signal by the IQ generator on the signal path can be eliminated. As a result, the necessity for providing the amplifier configured to obtain required signal power is eliminated, and power consumption can thus be reduced.

In the first embodiment, the gain of the VGA 12 is set from cos θ to a gain obtained by multiplying a gain set in advance by cos θ, and the gain of the VGA 13 is set from sin θ to a gain obtained by multiplying the gain set in advance by sin θ. In this manner, it is possible to amplify the amplitude at the gain set in advance while maintaining the phase shift amount of θ° of the output signal of the transmission mixer 21 incorporating the phase shift function.

Moreover, in the related-art circuit of FIG. 9, when a vector composition type phase shifter is applied in the IF band, a broad-band IQ generator in the IF band is required. Meanwhile, in the first embodiment, such an IQ generator is not required, and the band of the IF signal can thus be broadened. Therefore, the first embodiment can be applied even when the signal in the IF band is close to a DC signal and it is thus difficult to broaden a bandwidth ratio at a low frequency.

Moreover, in the first embodiment, the VGA 12 and the VGA 13 are operated in the IF band. Therefore, operation frequencies of transistors can be reduced as compared with the VGA 5 and the VGA 6 to be operated in the RF band required for the vector composition type phase shifter as in the related-art circuit illustrated in FIG. 9. As a result, power consumption can be suppressed.

Figure 2:
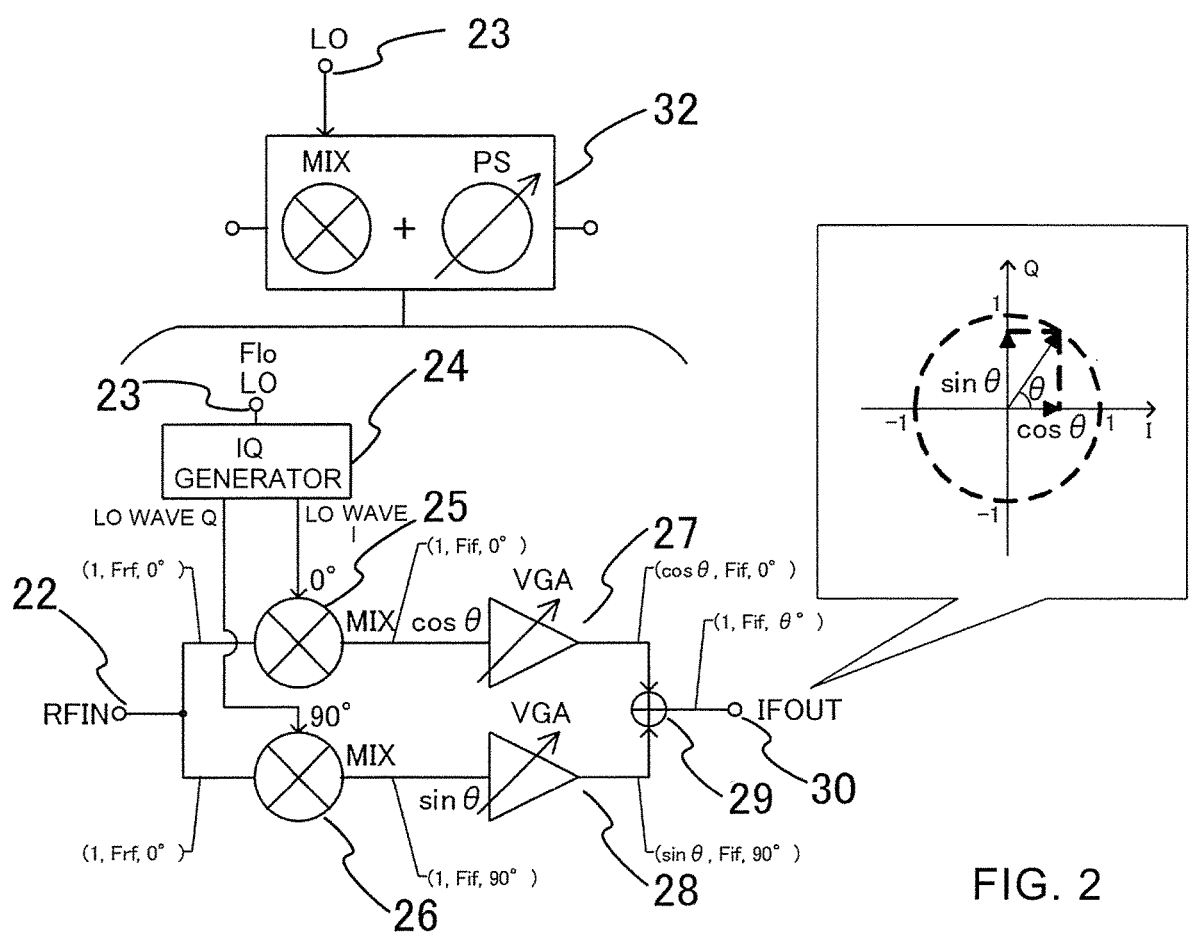
FIG. 2 is a diagram for illustrating one configuration example of a reception mixer incorporating a phase shift function according to the first embodiment of the present invention.

In the description given above, the mixer according to the first embodiment is applied to an up-converter configured to convert the IF signal to the RF signal, but the mixer according to the first embodiment is not limited to this application, and can also be applied to a down-converter configured to convert the RF signal to the IF signal. FIG. 2 is a diagram for illustrating one configuration example achieved when the mixer according to the first embodiment is used as a reception mixer 32. With the configuration illustrated in FIG. 2, the same effects can be provided also as the reception mixer.

A brief description is now given of the reception mixer 32 of FIG. 2.

The reception mixer 32 of FIG. 2 includes an IQ generator 24, a MIX 25 serving as a fifth mixer, a MIX 26 serving as a sixth mixer, a VGA 27 serving as a fifth VGA, a VGA 28 serving as a sixth VGA, a combiner 29 serving as a fourth combiner, and the control unit 300. The control unit 300 is not shown in FIG. 2 for the sake of simple illustration.

In the reception mixer 32, a signal (1, Frf, 0°) in the RF band input to an RFIN terminal 22, which is an input terminal of the RF signal, is divided into two portions, and the respective two portions are input to the MIX 25 and the MIX 26. It is assumed that the amplitudes remain the same.

The LO wave is input to the LO terminal 23 of the IQ generator 24. The IQ generator 24 outputs an LO wave (hereinafter referred to as "LO wave I") in phase with the LO wave and an LO wave (hereinafter referred to as "LO wave Q") having a phase difference of 90° with respect to the LO wave.

The MIX 25 executes mixing processing for the signal (1, Frf, 0°) in the RF band and an LO wave I (1, Flo, 0°) output from the IQ generator 24, to thereby obtain a signal in the IF band. In this mixing processing, the amplitudes are multiplied by one another, and a result is thus given by 1×1=1. The frequencies are subtracted from one another, and a result is thus given by Frf−Flo=Fif. The phases are subtracted from one another, and a result is thus given by 0−0=0°. Thus, the MIX 25 obtains a signal (1, Fif, 0°) in the IF band through this mixing processing, and outputs the signal. The signal output from the MIX 25 is referred to as "twelfth signal".

The MIX 26 executes mixing for the signal (1, Frf, 0°) in the RF band and an LO wave Q (1, Flo, 90°) output from the IQ generator 24, to thereby obtain a signal in the IF band. In this mixing processing, the amplitudes are multiplied by one another, and a result is thus given by 1×1=1. The frequencies are subtracted from one another, and a result is thus given by Frf−Flo=Fif. The phases are subtracted from one another, and a result is thus given by 90−0=90°. Thus, the MIX 26 obtains a signal (1, Fif, 90°) in the IF band through this mixing processing, and outputs the signal. The signal output from the MIX 26 is referred to as "thirteenth signal".

The signal (1, Fif, 0°) in the IF band output from the MIX 25 is input to the VGA 27. The VGA 27 has the gain of cos θ, and a signal (cos θ, Fif, 0°) in the IF band is thus output from the VGA 27. The signal output from the VGA 27 is referred to as "fourteenth signal".

The signal (1, Fif, 90°) in the IF band output from the MIX 26 is input to the VGA 28. The VGA 28 has the gain of sin θ, and a signal (sin θ, Fif, 90°) in the IF band is thus output from the VGA 28. The signal output from the VGA 28 is referred to as "fifteenth signal".

The combiner 29 applies vector composition to the output signal (cos θ, Fif, 0°) of the VGA 27 and the output signal (sin θ, Fif, 90°) of the VGA 28, to thereby output the signal (1, Fif, θ°) in the IF band. The signal output from the combiner 29 is referred to as "sixteenth signal".

In such a manner, in the reception mixer illustrated in FIG. 2, the input signal is converted in frequency through use of the LO wave I and the LO wave Q in the MIX 25 and the MIX 26, respectively, as illustrated in FIG. 2. Then, those signals converted in frequency are amplified at the gain of cos θ and the gain of sin θ by the VGA 27 and the VGA 28, respectively.

Thus, in the first embodiment, the frequency conversion function and the phase shift function are achieved as in the related art even with the configuration without providing the IQ generator 24 on the RF signal path also in the reception mixer of FIG. 2 similarly to the transmission mixer of FIG. 1, and the attenuation of the signal by the IQ generator on the IF signal path can thus be eliminated. As a result, the necessity for providing the amplifier configured to obtain required signal power is eliminated, and power consumption can thus be reduced.

Second Embodiment

Figure 3:
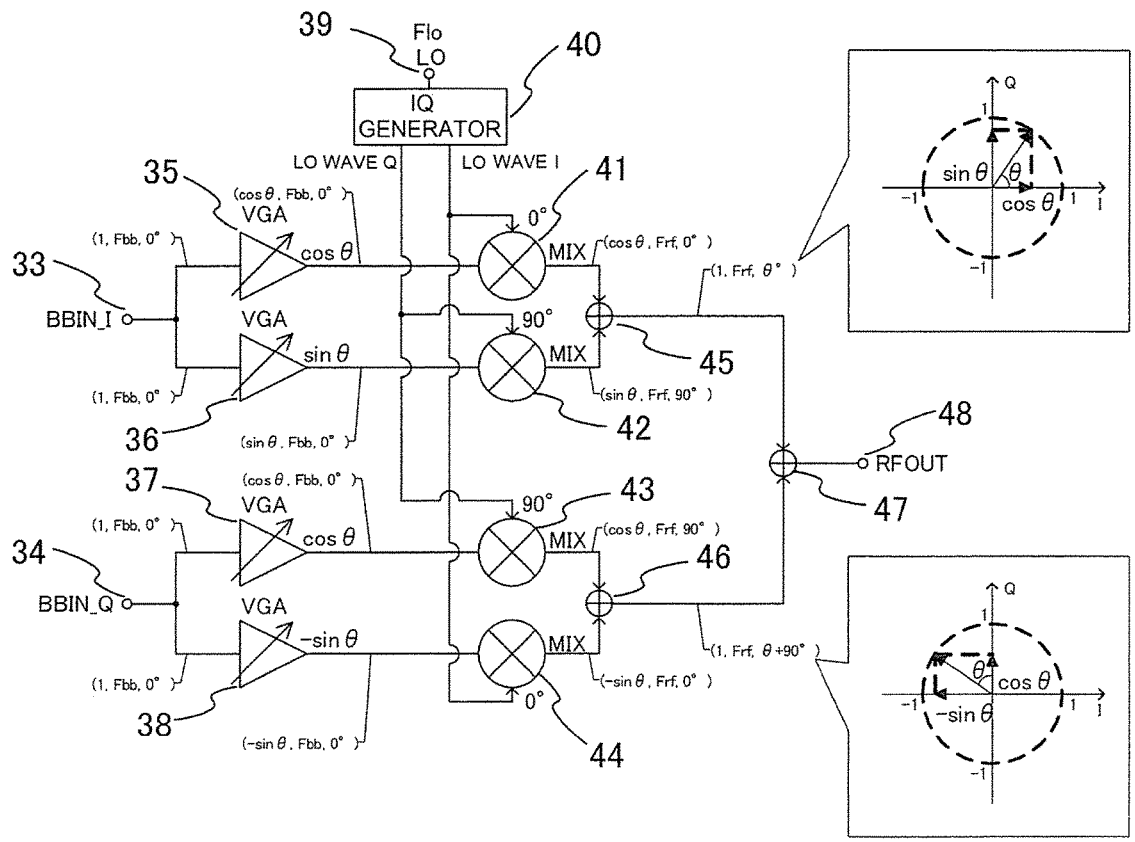
FIG. 3 is a diagram for illustrating one configuration example of a transmission quadrature mixer incorporating a phase shift function according to a second embodiment of the present invention.

FIG. 3 is a diagram for illustrating one configuration example of a mixer according to a second embodiment of the present invention. FIG. 3 is an illustration of one configuration example of a transmission quadrature mixer incorporating a phase shift function as the mixer. This transmission quadrature mixer includes a VGA 35 serving as a first VGA, a VGA 36 serving as a second VGA, a VGA 37 serving as a third VGA, a VGA 38 serving as a fourth VGA, an IQ generator 40, a MIX 41 serving as a first mixer, a MIX 42 serving as a second mixer, a MIX 43 serving as a third mixer, a MIX 44 serving as a fourth mixer, a combiner 45 serving as a first combiner, a combiner 46 serving as a second combiner, and a combiner 47 serving as a third combiner.

In FIG. 3, a BBIN_I terminal 33 is an input terminal configured to input an in-phase component in a broad band (BB). A BBIN_Q terminal 34 is an input terminal configured to input a quadrature-phase component in the BB. An LO terminal 39 is an input terminal configured to input the LO wave. An RFOUT terminal 48 is an output terminal configured to output a signal in the RF band. Moreover, a notation of, for example, "(1, Fbb, 0°)", of FIG. 3 indicates values of (amplitude, frequency, phase) at each node. Further, a frequency in the BB is indicated as Fbb. A frequency of the LO wave is indicated as Flo. A frequency in the RF band is indicated as Frf. A high/low relationship among frequencies in the respective frequency bands is given by Fbb<Frf=Flo±Fbb.

A description is now given of each of the components.

As illustrated in FIG. 3, the VGA 35 to the VGA 38, the MIX 41 to the MIX 44, and the combiner 45 to the combiner 47 are provided on a signal path between the BBIN_I terminal 33 and BBIN_Q terminal 34, and the RFOUT terminal 48. Although the IQ generator 40 inputs signals to the MIX 41 to the MIX 44, the IQ generator 40 itself is not provided on the signal path, and is arranged outside of the signal path.

Moreover, also in FIG. 3, the control unit 300 is provided. The control unit 300 is not shown in FIG. 3 for the sake of simple illustration. The value of θ° is input from the outside to the control unit 300. The value θ° is a phase shift amount at the RFOUT 48. The control unit 300 internally includes a circuit configured to calculate values of cos θ, sin θ, and −sin θ based on the value of θ°, to thereby control the gain of cos θ of the VGA 35 and the VGA 37, the gain of sin θ of the VGA 36, and the gain of −sin θ of the VGA 38.

One of the divided two portions of the signal (1, Fbb, 0°) in the BB input to the BBIN_I terminal 33 is input to the VGA 35. The VGA 35 amplifies the BB signal at the gain of cos θ. The VGA 35 is only required to be configured to achieve the gain of cos θ for any value of θ. Thus, the configuration is not particularly limited, and any configuration can be used as the VGA 35.

Another of the divided two portions of the signal (1, Fbb, 0°) in the BB input to the BBIN_I terminal 33 is input to the VGA 36. The VGA 36 amplifies the BB signal at the gain of sin θ. The VGA 36 is only required to be configured to achieve the gain of sin θ for any value of θ. Thus, the configuration is not particularly limited, and any configuration can be used as the VGA 36.

One of the divided two portions of the signal (1, Fbb, 0°) in the BB input to the BBIN_Q terminal 34 is input to the VGA 37. The VGA 37 amplifies the BB signal at the gain of cos θ. The VGA 37 is only required to be configured to achieve the gain of cos θ for any value of θ. Thus, the configuration is not particularly limited, and any configuration can be used as the VGA 37.

Another of the divided two portions of the signal (1, Fbb, 0°) in the BB input to the BBIN)_Q terminal 34 is input to the VGA 38. The VGA 38 amplifies the BB signal at the gain of −sin θ. The VGA 38 is only required to be configured to achieve the gain of −sin θ for any value of θ. Thus, the configuration is not particularly limited, and any configuration can be used as the VGA 38.

The LO wave is input to the LO terminal 39 of the IQ generator 40. The IQ generator 40 outputs an LO wave (hereinafter referred to as "LO wave I") in phase with the LO wave and an LO wave (hereinafter referred to as "LO wave Q") having a phase difference of 90° with respect to the LO wave. The IQ generator 40 is only required to be configured to output the LO wave I and the LO wave Q for the input signal. Thus, the configuration is not particularly limited, and any configuration can be used as the IQ generator 40.

The MIX 41 is connected to a subsequent stage of the VGA 35, and is provided on the signal path. The MIX 41 is a frequency converter having a function of mixing the output signal of the VGA 35 and the LO wave I output from the IQ generator 40 with one another. The MIX 41 outputs a sum signal and a difference signal of the two signals different in frequency from one another. Moreover, the MIX 41 has the function of mixing two signals, which are different in frequency from one another, with one another, and thus outputs a signal having a phase sum or a phase difference of the two signals also in terms of a phase relationship. For the sake of simple description, a consideration is only given of the function of summation of the MIX 41. That is, in this case, the MIX 41 multiplies amplitudes of the two signals by one another, and sums the frequencies and the phases of the two signals to one another.

The MIX 42 is connected to a subsequent stage of the VGA 36, and is provided on the signal path. The MIX 42 is a frequency converter having a function of mixing the output signal of the VGA 36 and the LO wave Q output from the IQ generator 40 with one another. The MIX 42 outputs a sum signal and a difference signal of the two signals different in frequency from one another. Moreover, the MIX 42 has the function of mixing two signals, which are different in frequency from one another, with one another, and thus outputs a signal having a phase sum or a phase difference of the two signals also in terms of a phase relationship. For the sake of simple description, a consideration is only given of the function of summation. That is, in this case, the MIX 42 multiplies amplitudes of the two signals by one another, and sums the frequencies and the phases of the two signals to one another.

The MIX 43 is connected to a subsequent stage of the VGA 37, and is provided on the signal path. The MIX 43 is a frequency converter having a function of mixing the output signal of the VGA 37 and the LO wave Q output from the IQ generator 40 with one another. The MIX 43 outputs a sum signal and a difference signal of the two signals different in frequency from one another. Moreover, the MIX 43 has the function of mixing two signals, which are different in frequency from one another, with one another, and thus outputs a signal having a phase sum or a phase difference of the two signals also in terms of a phase relationship. For the sake of simple description, a consideration is only given of the function of summation. That is, in this case, the MIX 43 multiplies amplitudes of the two signals by one another, and sums the frequencies and the phases of the two signals to one another.

The MIX 44 is connected to the VGA 38, and is provided on the signal path. The MIX 44 is a frequency converter having a function of mixing the output signal of the VGA 38 and the LO wave I output from the IQ generator 40 with one another. The MIX 44 outputs a sum signal and a difference signal of the two signals different in frequency from one another. Moreover, the MIX 44 has the function of mixing two signals, which are different in frequency from one another, with one another, and thus outputs a signal having a phase sum or a phase difference of the two signals also in terms of a phase relationship. For the sake of simple description, a consideration is only given of the function of summation. That is, in this case, the MIX 44 multiplies amplitudes of the two signals by one another, and sums the frequencies and the phases of the two signals to one another.

The combiner 45 executes vector composition for the output of the MIX 41 and the output of the MIX 42.

The combiner 46 executes vector composition for the output of the MIX 43 and the output of the MIX 44.

The combiner 47 executes vector composition for the output of the combiner 45 and the output of the combiner 46 so as to generate a signal (1, Frf, 0°) in the RF band, to thereby output the signal from the RFOUT terminal 48 to the outside.

A description is now given of an operation of the transmission quadrature mixer illustrated in FIG. 3.

In the quadrature mixer illustrated in FIG. 3, the signal (1, Fbb, 0°) in the BB input from the BBIN_I terminal 33 is divided into two portions, and the respective two portions are input to the VGA 35 and the VGA 36. The VGA 35 and the VGA 36 have the gain cos θ and the gain sin θ, respectively. Therefore, a signal (cos θ, Fbb, 0°) in the BB is output from VGA 35. A signal (sin θ, Fbb, 0°) in the BB is output from VGA 36. The signals output from the VGA 35 and the VGA 36 are referred to as "first signal" and "second signal", respectively.

Meanwhile, the signal (1, Fbb, 0°) in the BB input from the BBIN_Q terminal 34 is divided into two portions, and the respective two portions are input to the VGA 37 and the VGA 38. The VGA 37 and the VGA 38 have the gains cos θ and −sin θ, respectively. Therefore, a signal (cos θ, Fbb, 0°) in the BB is output from VGA 37. A signal (−sin θ, Fbb, 0°) in the BB is output from VGA 38. The signals output from the VGA 37 and the VGA 38 are referred to as "sixth signal" and "seventh signal", respectively.

The MIX 41 executes mixing for the signal (cos θ, Fbb, 0°) in the BB output from the VGA 35 and the LO wave I (1, Flo, 0°) output from the IQ generator 40 with one another, to thereby output a signal (cos θ, Frf, 0°) in the RF band as in the first embodiment. The signal output from the MIX 41 is referred to as "third signal".

The MIX 42 executes mixing for the signal (sin θ, Fbb, 0°) in the BB output from the VGA 36 and the LO wave Q (1, Flo, 90°) output from the IQ generator 40 with one another, to thereby output a signal (sin θ, Frf, 90°) in the RF band as in the first embodiment. The signal output from the MIX 42 is referred to as "fourth signal".

The MIX 43 executes mixing for the signal (cos θ, Fbb, 0°) in the BB output from the VGA 37 and the LO wave Q (1, Flo, 90°) output from the IQ generator 40 with one another, to thereby output a signal (cos θ, Frf, 90°) in the RF band as in the first embodiment. The signal output from the MIX 43 is referred to as "eighth signal".

The MIX 44 executes mixing for the signal (−sin θ, Fbb, 0°) in the BB output from the VGA 38 and the LO wave I (1, Flo, 0°) output from the IQ generator 40 with one another, to thereby output a signal (−sin θ, Frf, 0°) in the RF band as in the first embodiment. The signal output from the MIX 44 is referred to as "ninth signal".

The combiner 45 applies the vector composition to the output signal of the MIX 41 and the output signal of the MIX 42, to thereby output the signal (1, Frf, 0°) in the RF band as shown in the inserted graph of FIG. 3. The signal output from the combiner 45 is referred to as "fifth signal".

The combiner 46 applies the vector composition to the output signal of the MIX 43 and the output signal of the MIX 44, to thereby output the signal (1, Frf, 90+θ°) in the RF band as shown in another inserted graph of FIG. 3. The signal output from the combiner 46 is referred to as "tenth signal".

The combiner 47 executes vector composition of the output signal of the combiner 45 and the output signal of the combiner 46 so as to generate a signal obtained by the quadrature modulation in the RF band, to thereby output the signal from the RFOUT terminal 48 to the outside. The signal output from the combiner 47 is referred to as "eleventh signal".

As described above, in the second embodiment, the control unit 300 adjusts the gain of cos θ, sin θ, cos θ, and −sin θ of the VGA 35, the VGA 36, the VGA 37, and the VGA 38, respectively, to thereby be able to achieve any phase shift amount of θ°, and the phase shift function and the quadrature modulation function can thus be achieved in this configuration.

The mixer according to the second embodiment has the above-mentioned configuration, and when the mixer is used as the transmission mixer, the frequency conversion function and the phase shift function can be achieved as in the related art even with the configuration without providing the IQ generator 40 on the signal path. Therefore, the attenuation of the signal by the IQ generator on the signal path can be eliminated. As a result, the necessity for providing the amplifier configured to obtain the required signal power is eliminated, and power consumption can thus be reduced.

Moreover, in the second embodiment, the transmission mixer incorporating the phase shift function can be used in the quadrature modulation type in a transmitter, and can thus be used in a transmitter of the direct conversion type and a transmitter of the heterodyne type that requires an image rejection function.

In addition to the effects described above, the quadrature mixer according to the second embodiment can share the IQ generator for the LO wave, which is originally required in the quadrature modulation type, so as to achieve the phase shift function and the frequency conversion function. Therefore, the quadrature mixer has a higher effect for the reduction in loss of the RF signal than the related-art circuit illustrated in FIG. 9.

Figure 4:
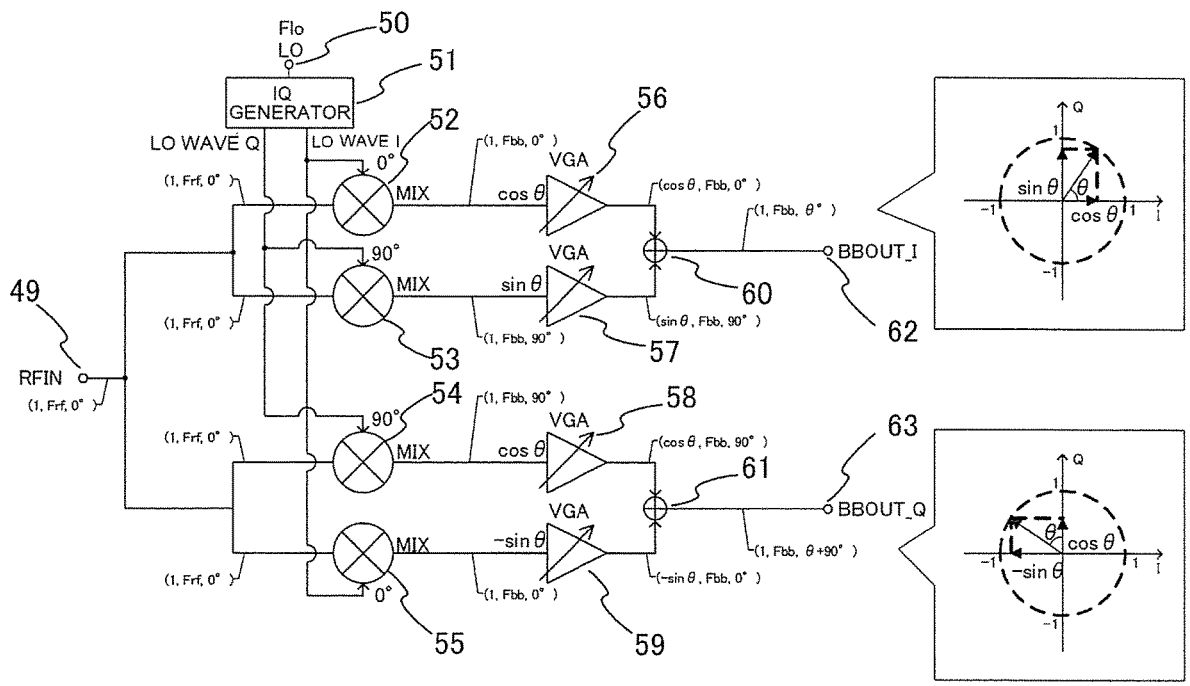
FIG. 4 is a diagram for illustrating one configuration example of a reception quadrature mixer incorporating a phase shift function according to the second embodiment of the present invention.

In the second embodiment, the quadrature mixer is used for the up-converter configured to convert the BB signal to the RF signal, but the present invention is not limited to this example, and can also be applied to a down-converter configured to convert the RF signal to the BB signal. FIG. 4 is a diagram for illustrating one configuration example of a reception quadrature mixer incorporating a phase shift function according to the second embodiment. With the configuration illustrated in FIG. 4, the same effects can be provided also in a receiver.

A brief description is now given of the reception quadrature mixer of FIG. 4.

The reception quadrature mixer of FIG. 4 includes an IQ generator 51, a MIX 52 serving as a fifth mixer, a MIX 53 serving as a sixth mixer, a MIX 54 serving as a seventh mixer, a MIX 55 serving as an eighth mixer, a VGA 56 serving as a fifth VGA, a VGA 57 serving as a sixth VGA, a VGA 58 serving as a seventh VGA, a VGA 59 serving as an eighth VGA, a combiner 60 serving as a fourth combiner, a combiner 61 serving as a fifth combiner, and the control unit 300. The control unit 300 is not shown in FIG. 4 for the sake of simple illustration.

In the reception quadrature mixer, the signal (1, Frf, 0°) in the RF band input to an RFIN terminal 49, which is an input terminal for the RF signal, is first divided into the two portions. Each of those two signals are further divided into two portions, the two signals are thus divided into four portions in total, and the respective four signals are input to the MIX 52 to MIX 55. It is assumed that the amplitudes remain the same.

The LO wave is input to the LO terminal 50 of the IQ generator 51. The IQ generator 51 outputs an LO wave (hereinafter referred to as "LO wave I") in phase with the LO wave and an LO wave (hereinafter referred to as "LO wave Q") having a phase difference of 90° with respect to the LO wave.

The MIX 52 executes mixing processing for the signal (1, Frf, 0°) in the RF band and the LO wave I (1, Flo, 0°) output from the IQ generator 51, to thereby obtain and output a signal (1, Fbb, 0°) in the BB. The signal output from the MIX 52 is referred to as "twelfth signal".

The MIX 53 executes mixing processing for the signal (1, Frf, 0°) in the RF band and the LO wave Q (1, Flo, 90°) output from the IQ generator 51, to thereby obtain and output a signal (1, Fbb, 90°) in the BB. The signal output from the MIX 53 is referred to as "thirteenth signal".

The MIX 54 executes mixing processing for the signal (1, Frf, 0°) in the RF band and the LO wave Q (1, Flo, 90°) output from the IQ generator 51, to thereby obtain and output a signal (1, Fbb, 90°) in the BB. The signal output from the MIX 54 is referred to as "seventeenth signal".

The MIX 55 executes mixing processing for the signal (1, Frf, 0°) in the RF band and the LO wave I (1, Flo, 0°) output from the IQ generator 51, to thereby obtain and output a signal (1, Fbb, 0°) in the BB. The signal output from the MIX 55 is referred to as "eighteenth signal".

The signal (1, Fbb, 0°) in the BB output from the MIX 52 is input to the VGA 56. The VGA 56 has the gain of cos θ, and a signal (cos θ, Fbb, 0°) in the BB is thus output from the VGA 56. The signal output from the VGA 56 is referred to as "fourteenth signal".

The signal (1, Fbb, 90°) in the BB output from the MIX 53 is input to the VGA 57. The VGA 57 has the gain of sin θ, and a signal (sin θ, Fbb, 90°) in the BB is thus output from the VGA 57. The signal output from the VGA 57 is referred to as "fifteenth signal".

The signal (1, Fbb, 90°) in the BB output from the MIX 54 is input to the VGA 58. The VGA 58 has the gain of cos θ, and a signal (cos θ, Fbb, 90°) in the BB is thus output from the VGA 58. The signal output from the VGA 58 is referred to as "nineteenth signal".

The signal (1, Fbb, 0°) in the BB output from the MIX 55 is input to the VGA 59. The VGA 59 has the gain of −sin θ, and a signal (−sin θ, Fbb, 0°) in the BB is thus output from the VGA 59. The signal output from the VGA 59 is referred to as "twentieth signal".

The combiner 60 applies the vector composition to the output signal (cos θ, Fbb, 0°) of the VGA 56 and the output signal (sin θ, Fbb, 90°) of the VGA 57 as shown in the inserted graph of FIG. 4, to thereby generate a signal (1, Fbb, 0°) in the BB, and output the signal from a BBOUT_I terminal 62 to the outside. The signal output from the combiner 60 is referred to as "sixteenth signal".

The combiner 61 applies the vector composition to the output signal (cos θ, Fbb, 90°) of the VGA 58 and the output signal (−sin θ, Fbb, 0°) of the VGA 59 as shown in the inserted graph of FIG. 4, to thereby generate a signal (1, Fbb, θ+90°) in the BB, and output the signal from a BBOUT_Q terminal 63 to the outside. The signal output from the combiner 60 is referred to as "twenty-first signal".

In the second embodiment, the frequency conversion function and the phase shift function are achieved as in the related art even with the configuration without providing the IQ generator 51 on the signal path also in the reception mixer of FIG. 4 similarly to the transmission mixer of FIG. 3, and the attenuation of the signal by the IQ generator on the signal path can thus be eliminated. As a result, the necessity for providing the amplifier configured to obtain the required signal power is eliminated, and the power consumption can thus be reduced.

Third Embodiment

Figure 5:
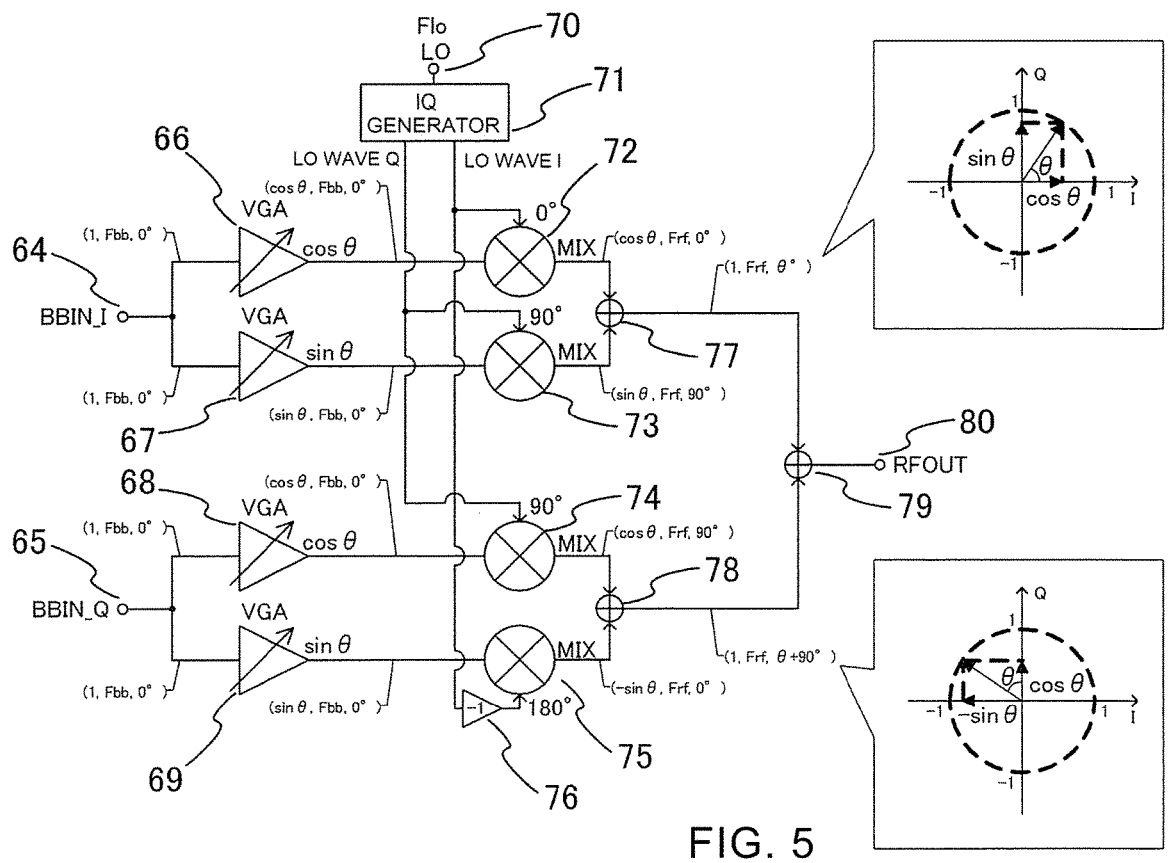
FIG. 5 is a diagram for illustrating one configuration example of a transmission quadrature mixer incorporating a phase shift function according to a third embodiment of the present invention.

FIG. 5 is a diagram for illustrating one configuration example of a mixer according to a third embodiment of the present invention. FIG. 5 is an illustration of one configuration example of a transmission quadrature mixer incorporating a phase shift function as a mixer. This transmission quadrature mixer includes a VGA 66 serving as a first VGA, a VGA 67 serving as a second VGA, a VGA 68 serving as a third VGA, a VGA 69 serving as a fourth VGA, an IQ generator 71, a MIX 72 serving as a first mixer, a MIX 73 serving as a second mixer, a MIX 74 serving as a third mixer, a MIX 75 serving as a fourth mixer, a combiner 77 serving as a first combiner, a combiner 78 serving as a second combiner, a combiner 79 serving as a third combiner, and an inverter 76.

In FIG. 5, a BBIN_I terminal 64 is an input terminal configured to input an in-phase component in the BB. A BBIN_Q terminal 65 is an input terminal configured to input a quadrature-phase component in the BB. An LO terminal 70 is an input terminal configured to input the LO wave. An RFOUT terminal 80 is an output terminal configured to output a signal in the RF band.

The transmission quadrature mixer of FIG. 5 is configured as described above, and has approximately the same configuration as the configuration of the transmission quadrature mixer of FIG. 3 described in the second embodiment. A difference in configuration between FIG. 5 and FIG. 3 resides in that the gain of the VGA 38 of FIG. 3 is −sin θ while the gain of the VGA 69 of FIG. 5 is sin θ and in that the inverter 76 is added.

The other configurations and operations are the same as those of the second embodiment, and a description thereof is thus omitted herein.

As illustrated in FIG. 5, the inverter 76 is connected between the IQ generator 71 and the MIX 75. The inverter 76 inverts the LO wave I output from the IQ generator 71, to thereby generate an inverted signal (−1, Flo, 0°) of the LO wave I (1, Flo, 0°), and inputs the inverted signal to the MIX 75.

Therefore, in the third embodiment, the MIX 75 executes mixing for the signal (sin θ, Fbb, 0°) in the BB output from the VGA 39 and the inverted signal (−1, Flo, 0°) of the LO wave I (1, Flo, 0°) output from the IQ generator 40, to thereby output the signal (−sin θ, Frf, 0°) in the RF band. Thus, the signal output from the MIX 75 is the same as the signal output by the MIX 44 of FIG. 3 described in the second embodiment.

Moreover, in the third embodiment, the control unit 300 internally includes a circuit configured to calculate values of cos θ and sin θ based on the value of θ°, to thereby control the gain of cos θ of the VGA 66 and the VGA 68 and the gain of sin θ of the VGA 67 and the VGA 69. The control unit 300 is not shown in FIG. 5 for the sake of simple illustration.

When the IQ generator 71 and the MIX 75 are differential circuits, it is not required to provide the inverter 76, and the same effects can be provided by connecting differential output terminals of the IQ generator 71 and differential input terminals of the MIX 75 to one another in an inverted manner.

In the third embodiment, the above-mentioned configuration is provided, and all of the signals output from the MIX 72 to the MIX 75 are the same as those of the corresponding MIX 41 to MIX 44 in the second embodiment illustrated in FIG. 3. As a result, the same effects as those of the second embodiment can be provided.

That is, the mixer according to the third embodiment has the above-mentioned configuration, and when the mixer is used as the transmission mixer, the frequency conversion function and the phase shift function can be achieved as in the related art even with the configuration without providing the IQ generator 71 on the signal path. Therefore, the attenuation of the signal by the IQ generator on the signal path can be eliminated. As a result, the necessity for providing the amplifier configured to obtain required signal power is eliminated, and power consumption can thus be reduced.

Figure 6:
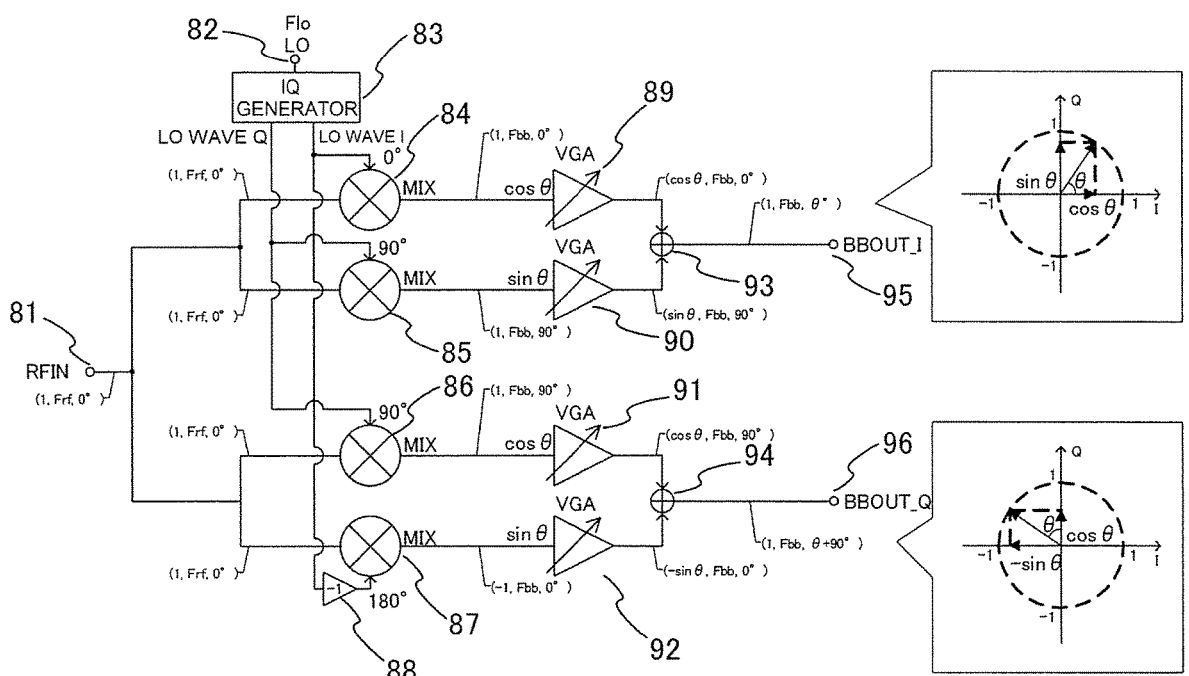
FIG. 6 is a diagram for illustrating one configuration example of a reception quadrature mixer incorporating a phase shift function according to the third embodiment of the present invention.

In the third embodiment, the quadrature mixer is used for the up-converter configured to convert the BB signal to the RF signal in the description given above, but the present invention is not limited to this example, and can be applied to a down-converter configured to convert the RF signal to the BB signal. FIG. 6 is a diagram for illustrating one configuration example of a reception quadrature mixer incorporating a phase shift function according to the third embodiment of the present invention.

The reception quadrature mixer of FIG. 6 includes an IQ generator 83, a MIX 84 serving as a fifth mixer, a MIX 85 serving as a sixth mixer, a MIX 86 serving as a seventh mixer, a MIX 87 serving as an eighth mixer, a VGA 89 serving as a fifth VGA, a VGA 90 serving as a sixth VGA, a VGA 91 serving as a seventh VGA, a VGA 92 serving as an eighth VGA, a combiner 93 serving as a fourth combiner, a combiner 94 serving as a fifth combiner, and the control unit 300. The control unit 300 is not shown in FIG. 6 for the sake of simple illustration.

The reception quadrature mixer of FIG. 6 is configured in such a manner, and has approximately the same configuration as the configuration of the reception quadrature mixer of FIG. 4 described in the second embodiment. A difference in configuration between FIG. 6 and FIG. 4 resides in that the gain of the VGA 59 of FIG. 4 is −sin θ while the gain of the VGA 92 of FIG. 6 is sin θ and in that the inverter 88 is added.

As illustrated in FIG. 6, the inverter 88 is connected between the IQ generator 83 and the MIX 87. The inverter 88 inverts the LO wave I output from the IQ generator 83, to thereby generate an inverted signal (−1, Flo, 0°) of the LO wave I (1, Flo, 0°), and inputs the inverted signal to the MIX 87.

Therefore, the MIX 87 executes mixing for the signal (1, Frf, 0°) in the RF band and the inverted signal (−1, Flo, 0°) of the LO wave I (1, Flo, 0°) output from the IQ generator 83, to thereby obtain and output a signal (1, Fbb, 0°) in the BB.

The signal (−1, Fbb, 0°) in the BB output from the MIX 87 is input to the VGA 92. The VGA 59 has the gain of sin θ, and a signal (−sin θ, Fbb, 0°) in the BB is thus output from the VGA 59. Accordingly, the signal output from the VGA 92 is the same as the signal output by the VGA 59 of FIG. 4 described in the second embodiment.

In such a manner, with the configuration illustrated in FIG. 6, the same effects as that of the transmitter can be provided also in the receiver.

In the third embodiment, in the transmission quadrature mixer of FIG. 5, the VGA 66 and the VGA 68 have the common gain of cos θ, and the VGA 67 and the VGA 69 have the common gain of sin θ. Thus, it is possible to reduce a circuit scale in the control unit 300 by unifying circuits configured to control the gains of the VGA 66 and the VGA 68, and unifying circuits configured to control the gains of the VGA 67 and the VGA 69.

Similarly, in the third embodiment, in the reception quadrature mixer of FIG. 6, the VGA 89 and the VGA 91 have the common gain of cos θ, and the VGA 90 and the VGA 92 have the common gain of sin θ. Thus, it is possible to reduce the circuit scale in the control unit 300 by unifying circuits configured to control the gains of the VGA 89 and the VGA 91, and unifying circuits configured to control the gains of the VGA 90 and the VGA 92.

In the third embodiment, the frequency conversion function and the phase shift function are achieved as in the related art even with the configuration without providing the IQ generator 83 on the signal path as the transmission mixer of FIG. 5 also in the reception mixer of FIG. 6, and the attenuation of the signal by the IQ generator on the signal path can thus be eliminated. As a result, the necessity for providing the amplifier configured to obtain required signal power is eliminated, and power consumption can thus be reduced.

When the circuits configured to control the gains are unified as in the third embodiment, errors in the gains of the VGAs caused by set values for the gains of the control circuits do not influence quadrature accuracy, and still higher quadrature accuracy than that in the second embodiment can be achieved. A description is now given of a reason therefor.

Figure 7:
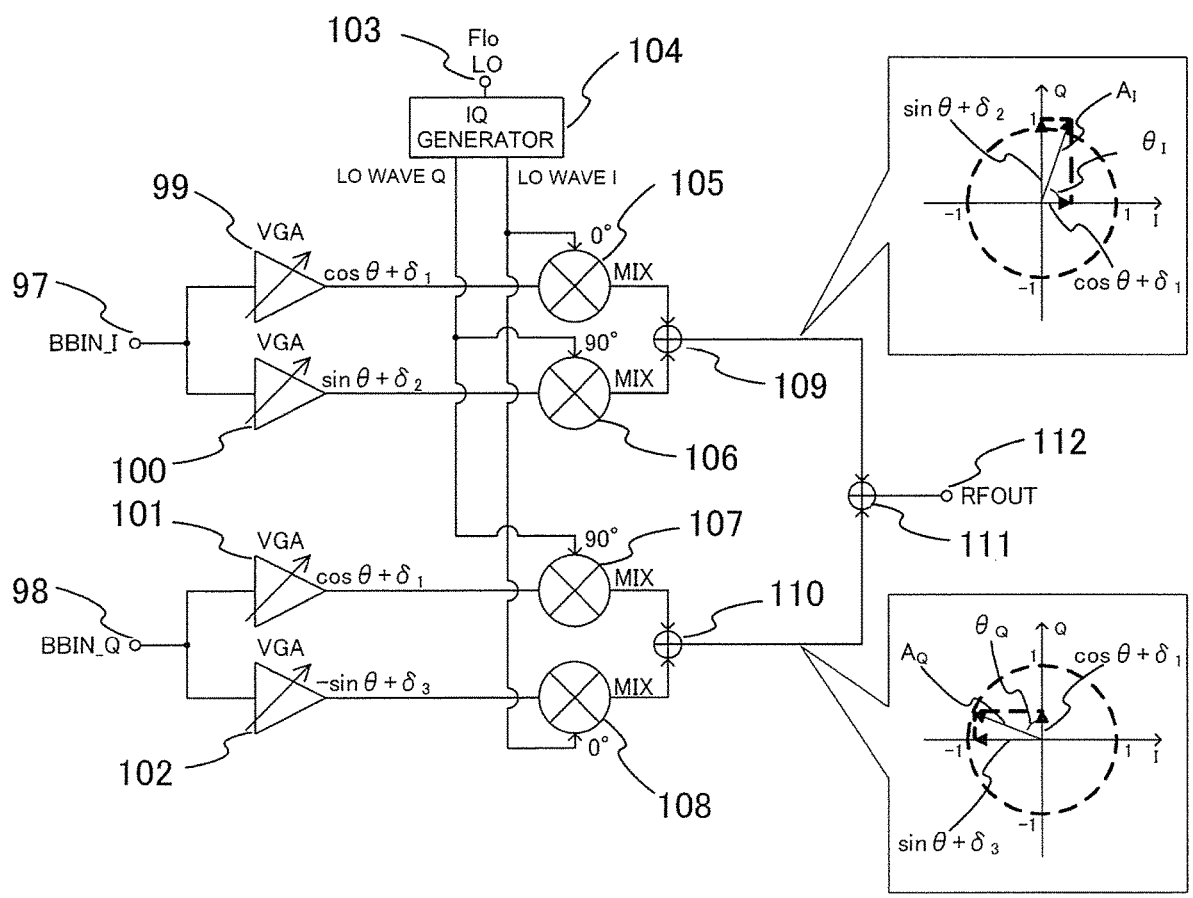
FIG. 7 is an explanatory diagram for illustrating quadrature accuracy of a transmission signal in the transmission quadrature mixer according to the second embodiment of the present invention.

FIG. 7 is a diagram for illustrating the quadrature accuracy of the transmission signal in the second embodiment. The configuration of FIG. 7 is completely the same as that of FIG. 3 described in the second embodiment, but for the sake of description, reference numerals different from those of FIG. 3 are assigned to the respective components in FIG. 7.

As illustrated in FIG. 7, in the configuration in the second embodiment, an error δ1 occurs when the gain of cos θ is set, an error δ2 occurs when the gain of sin θ is set, and an error δ3 occurs when the gain of −sin θ is set, due to errors in the set values of the gain control circuits. In this case, δ1≠δ2≠δ3.

Thus, the respective gains of a VGA 99, a VGA 100, a VGA 101, and a VGA 102 are cos θ+δ1, sin θ+δ2, cos θ+δ1, and −sin θ+δ3.

Moreover, the input signal of the in-phase component and the input signal of the quadrature-phase component in the BB are in the quadrature relationship, and the LO wave I and the LO wave Q are in the quadrature relationship. The amplitude of the output signal of the combiner 109 is $A_I$, and the phase shift amount thereof is $\theta_I°$. Moreover, similarly, the amplitude of the output signal of the combiner 110 is $A_Q$, and the phase shift amount thereof is $\theta_Q°$.

When the output signal of the combiner 109 and the output signal of the combiner 110 are equal to one another in amplitude and in phase shift amount, the quadrature relationship between the input signal of the in-phase component and the input signal of the quadrature-phase component in the BB can be maintained. However, when the errors δ1, δ2, and δ3 in gain occur, $A_I \neq A_Q$ and $\theta_I \neq \theta_Q$, and hence the quadrature relationship between the input signal of the in-phase component and the input signal of the quadrature-phase component in the BB cannot be maintained.

Meanwhile, in the third embodiment, the quadrature relationship between the input signal in the in-phase component and the input signal in the quadrature-phase component in the BB can be maintained. A description is now given of a reason for that.

Figure 8:
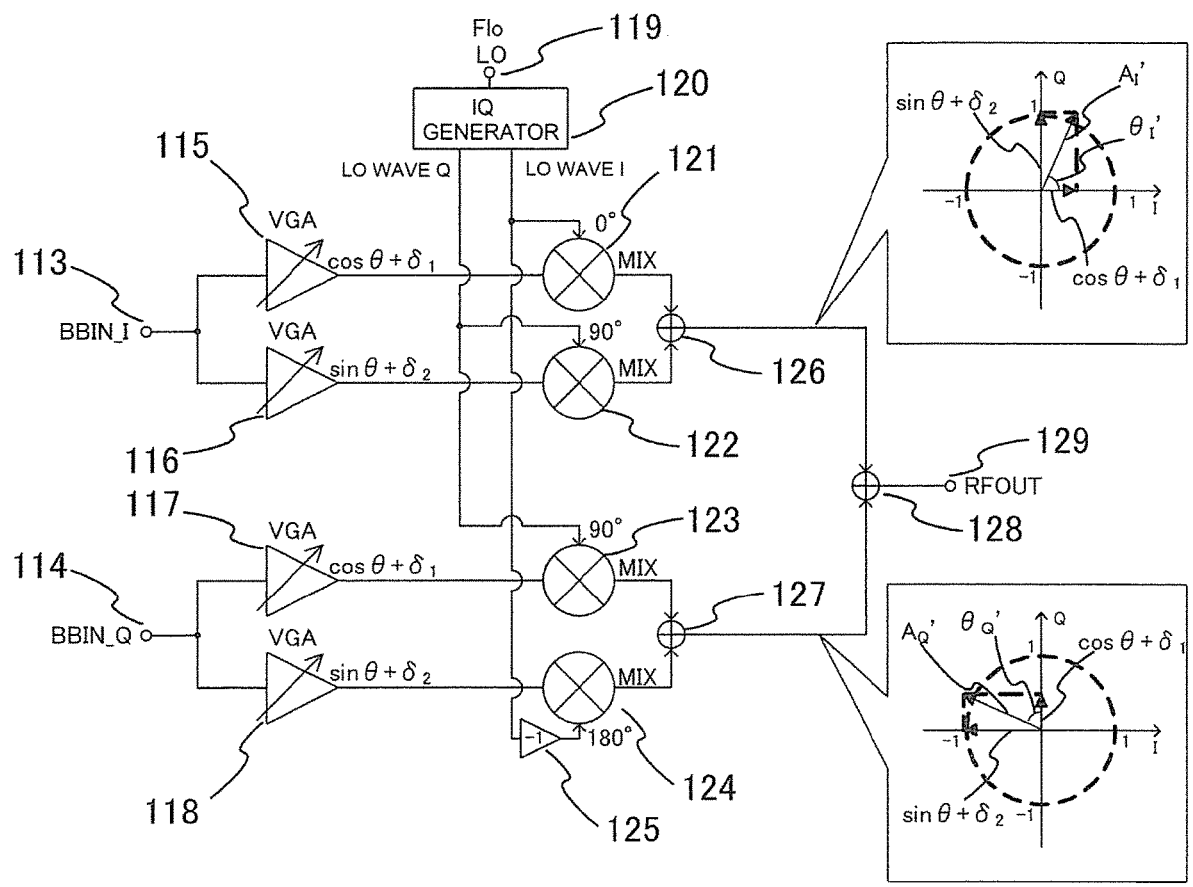
FIG. 8 is an explanatory diagram for illustrating quadrature accuracy of a transmission signal in the transmission quadrature mixer according to the third embodiment of the present invention.

FIG. 8 is a diagram for illustrating the quadrature accuracy of the transmission signal in the third embodiment. The configuration of FIG. 8 is completely the same as that of FIG. 5 described in the third embodiment, but for the sake of description, reference numerals different from those of FIG. 5 are assigned to the respective components in FIG. 8.

In the configuration in the third embodiment illustrated in FIG. 8, it is assumed that the same errors in the gains as those of FIG. 7 occur due to the errors in the set values of the gain control circuits. That is, the error δ1 occurs when the gain of cos θ is set, and the error δ2 occurs when the gain of sin θ is set. In this case, δ1≠δ2.

When the same errors in gain occur in FIG. 7 and FIG. 8, regarding the set value for the gain of the fourth VGA, the gain in the second embodiment of FIG. 7 is −sin θ, and the error in gain that occurs is thus δ3. However, the gain in the third embodiment of FIG. 8 is sin θ, and the error in gain that occurs is thus δ2. Thus, the respective gains of a VGA 115, a VGA 116, a VGA 117, and a VGA 118 are cos θ+δ1, sin θ+δ2, cos θ+δ1, and sin θ+δ2.

In this case, the amplitude of the output signal of the combiner 126 is $A_I'$ and the phase shift amount thereof is $\theta_I'°$, and the amplitude of the output signal of the combiner 127 is $A_Q'$ and the phase shift amount thereof is $\theta_Q'°$. The gains of the VGA 115 and the gain of the VGA 117 are cos θ+δ1 and are thus equal to one another. The gains of the VGA 116 and the gain of the VGA 118 are sin θ+δ2 and are thus equal to one another. As a result, $A_I'=A_Q'$, and $\theta_I'=\theta_Q'$, and the quadrature relationship between the input signal of the in-phase component and the input signal of the quadrature-phase component in the BB can be maintained. Thus, higher quadrature accuracy than that in the second embodiment can be achieved in the third embodiment.

As described above, the third embodiment has basically the same configuration as that of the second embodiment, and hence the same effects as those in the second embodiment can be provided. Further, as illustrated in FIG. 5, the third embodiment is configured such that the gains of the VGA 66 and the VGA 68 are the same and the gains of VGA 67 and the VGA 69 are the same. As a result, the quadrature relationship between the input signal of the in-phase component and the input signal of the quadrature-phase component in the BB can be maintained. Thus, higher quadrature accuracy than that in the second embodiment can be achieved in the third embodiment.

A brief description is now given of a hardware configuration of the control unit 300 in the first embodiment to the third embodiment. In the first embodiment to the third embodiment, the control unit 300 includes a controller. The controller includes a processor and a memory. The respective functions forming the control unit 300 are achieved by software, firmware, dedicated circuits, or a combination thereof. The software and the firmware are described as programs, and are stored in the memory. The processor is configured to read and execute the programs stored in the memory, to thereby achieve the respective functions of the control 300.

REFERENCE SIGNS LIST

12, 13 VGA, 15 IQ generator, 16, 17 MIX, 18 combiner, 24 IQ generator, 25, 26 MIX, 27, 28 VGA, 29 combiner, 35, 36, 37 VGA, 40 IQ generator, 41, 42, 43, 44 MIX, 45, 46 combiner, 51 IQ generator, 52, 53, 54, 55 MIX, 56, 57, 58, 59 VGA, 60, 61 combiner, 66, 67, 68, 69 VGA, 71 IQ generator, 72, 73, 74, 75 MIX, 77, 78, 79 combiner, 83 IQ generator, 84, 85, 86, 87 MIX, 89, 90, 91, 92 VGA, 93, 94 combiner, 76, 88 inverter, 300 control unit

The invention claimed is:

1. A mixer, comprising:

a controller configured to input a value of a phase shift amount of θ°, and calculate a gain of cos θ and a gain of sin θ so as to execute control;

a first VGA configured to input an input signal in a first frequency band from an input terminal, and amplify the input signal at the gain of cos θ to output the amplified input signal as a first signal;

a second VGA configured to input the input signal from the input terminal, and amplify the input signal at the gain of sin θ to output the amplified input signal as a second signal;

an IQ generator configured to input an LO wave, and output a first LO wave in phase with the LO wave and a second LO wave having a phase difference of 90° with respect to the LO wave;

a first mixer, which is connected to a subsequent stage of the first VGA, and is configured to input the first LO wave output from the IQ generator, and use the first LO wave so as to apply, to the first signal, frequency conversion to a second frequency band, to thereby generate a third signal in phase with the input signal;

a second mixer, which is connected to a subsequent stage of the second VGA, and is configured to input the second LO wave output from the IQ generator, and use the second LO wave so as to apply, to the second signal, frequency conversion to the second frequency band, to thereby generate a fourth signal having a phase difference of 90° with respect to the input signal;

a combiner, which is connected to a subsequent stage of the first mixer and the second mixer, and is configured to apply vector composition to the third signal and the fourth signal, to thereby generate and output a fifth signal shifted in phase by the phase shift amount of θ° with respect to the input signal;

a third VGA configured to input a second input signal in the first frequency band from a second input terminal, and amplify the second input signal at the gain of cos θ to output the amplified second input signal as a sixth signal;

a fourth VGA configured to input the second input signal from the second input terminal, and amplify the second input signal at a gain of −sin θ to output the amplified second input signal as a seventh signal;

a third mixer, which is connected to a subsequent stage of the third VGA, and is configured to input the second LO wave output from the IQ generator, and use the second LO wave so as to apply, to the sixth signal, frequency conversion to the second frequency band, to thereby generate an eighth signal having a phase difference of 90° with respect to the second input signal;

a fourth mixer, which is connected to a subsequent stage of the fourth VGA, and is configured to input the first LO wave output from the IQ generator, and use the first LO wave so as to apply, to the seventh signal, frequency conversion to the second frequency band, to thereby generate a ninth signal having a phase difference of 180° with respect to the second input signal;

a second combiner, which is connected to a subsequent stage of the third mixer and the fourth mixer, and is configured to apply vector composition to the eighth signal and the ninth signal, to thereby generate and output a tenth signal shifted in phase by a value obtained by adding 90° to the phase shift amount of 0° with respect to the second input signal; and a third combiner configured to combine the fifth signal output from the combiner and the tenth signal output from the second combiner with one another to output a combined signal, wherein the controller is configured to control the gain of cos θ, the gain of sin θ and the gain of −sin θ.

2. The mixer according to claim 1, wherein the input signal to be input to the input terminal and the second input signal to be input to the second input terminal have a quadrature relationship.

3. A mixer, comprising:
a controller configured to input a value of a phase shift amount of θ°, and calculate a gain of cos θ and a gain of sin θ so as to execute control;

an IQ generator configured to input an LO wave, and output a first LO wave in phase with the LO wave and a second LO wave having a phase difference of 90° with respect to the LO wave;

a first mixer configured to input a first input signal in a first frequency band from a first input terminal and input the first LO wave output from the IQ generator, and use the first LO wave so as to apply, to the first input signal, frequency conversion to a second frequency band, to thereby generate a first signal in phase with the first input signal;

a second mixer configured to input the first input signal from the first input terminal and input the second LO wave output from the IQ generator, and use the second LO wave so as to apply, to the first input signal, frequency conversion to the second frequency band, to thereby generate a second signal having a phase difference of 90° with respect to the first input signal;

a first VGA, which is connected to a subsequent stage of the first mixer, and is configured to input the first signal from the first mixer, and amplify the first signal at the gain of cos θ to output the amplified first signal as a third signal;

a second VGA, which is connected to a subsequent stage of the second mixer, and is configured to input the second signal from the second mixer, and amplify the second signal at the gain of sin θ to output the amplified second signal as a fourth signal;

a first combiner, which is connected to a subsequent stage of the first VGA and the second VGA, and is configured to apply vector composition to the third signal output from the first VGA and the fourth signal output from the second VGA, to thereby generate and output a fifth signal shifted in phase by the phase shift amount of θ° with respect to the first input signal;

a third mixer configured to input the first input signal from the first input terminal and input the second LO wave output from the IQ generator, and use the second LO wave so as to apply, to the first input signal, frequency conversion to the second frequency band, to thereby generate a sixth signal having a phase difference of 90° with respect to the first input signal;

a fourth mixer configured to input the first input signal from the first input terminal and input the first LO wave output from the IQ generator, and use the first LO wave so as to apply, to the first input signal, frequency conversion to the second frequency band, to thereby generate a seventh signal in phase with the first input signal;

a third VGA, which is connected to a subsequent stage of the third mixer, and is configured to input the sixth signal from the third mixer, and amplify the sixth signal at the gain of cos θ to output the amplified sixth signal as than eighth signal;

a fourth VGA, which is connected to a subsequent stage of the fourth mixer, and is configured to input the seventh signal from the fourth mixer, and amplify the seventh signal at a gain of −sin θ to output the amplified seventh signal as a ninth signal; and a second combiner, which is connected to a subsequent stage of the third VGA and the fourth VGA, and is configured to apply vector composition to the eighth signal output from the third VGA and the ninth signal output from the fourth VGA, to thereby generate and output a tenth signal shifted in phase by a value obtained by adding 90° to the phase shift amount of θ° with respect to the first input signal, wherein the controller is configured to control the gain of cos θ, the gain of sin θ, and the gain of −sin θ, and wherein all of the first input signals to be input from the first input terminal to the first mixer, the second mixer, the third mixer, and the fourth mixer are in phase.

4. A mixer, comprising:
a controller configured to input a value of a phase shift amount of θ°, and calculate a gain of cos θ and a gain of sin θ so as to execute control;

an IQ generator configured to input an LO wave, and output a first LO wave in phase with the LO wave and a second LO wave having a phase difference of 90° with respect to the LO wave;

a first mixer configured to input a first input signal in a first frequency band from a first input terminal and input the first LO wave output from the IQ generator, and use the first LO wave so as to apply, to the first input signal, frequency conversion to a second frequency band, to thereby generate a first signal in phase with the first input signal;

a second mixer configured to input the first input signal from the first input terminal and input the second LO wave output from the IQ generator, and use the second LO wave so as to apply, to the first input signal, frequency conversion to the second frequency band, to thereby generate a second signal having a phase difference of 90° with respect to the first input signal;

a first VGA, which is connected to a subsequent stage of the first mixer, and is configured to input the first signal from the first mixer, and amplify the first signal at the gain of cos θ to output the amplified first signal as a third signal;

a second VGA, which is connected to a subsequent stage of the second mixer, and is configured to input the second signal from the second mixer, and amplify the second signal at the gain of sin θ to output the amplified second signal as a fourth signal;

a first combiner, which is connected to a subsequent stage of the first VGA and the second VGA, and is configured to apply vector composition to the third signal output from the first VGA and the fourth signal output from the second VGA, to thereby generate and output a fifth signal shifted in phase by the phase shift amount of θ° with respect to the first input signal;

a third mixer configured to input the first input signal from the first input terminal and input the second LO wave output from the IQ generator, and use the second LO wave so as to apply, to the first input signal, frequency conversion to the second frequency band, to thereby generate a sixth signal having a phase difference of 90° with respect to the first input signal;

an inverter connected to the IQ generator and configured to output an inverted signal of the first LO wave output from the IQ generator;

a fourth mixer configured to input the first input signal from the first input terminal and input the inverted signal of the first LO wave output from the inverter, and use the inverted signal of the first LO wave so as to apply, to the first input signal, frequency conversion to the second frequency band, to thereby generate a seventh signal in phase with the first input signal;

a third VGA, which is connected to a subsequent stage of the third mixer, and is configured to input the sixth signal from the third mixer, and amplify the sixth signal at the gain of cos θ to output the amplified sixth signal as an eighth signal;

a fourth VGA, which is connected to a subsequent stage of the fourth mixer, and is configured to input the seventh signal from the fourth mixer, and amplify the seventh signal at a gain of sin θ to output the amplified seventh signal as a ninth signal; and a second combiner, which is connected to a subsequent stage of the third VGA and the fourth VGA, and is configured to apply vector composition to the eighth signal output from the third VGA and the ninth signal output from the fourth VGA, to thereby generate and output a tenth signal shifted in phase by a value obtained by adding 90° to the phase shift amount of θ° with respect to the first input signal, wherein the controller is configured to control the gain of cos θ and the gain of sin θ, and wherein all of the first input signals to be input from the first input terminal to the first mixer, the second mixer, the third mixer, and the fourth mixer are in phase.

* * * * *